(12) United States Patent
Coolbaugh et al.

(10) Patent No.: US 7,550,787 B2
(45) Date of Patent: Jun. 23, 2009

(54) VARIED IMPURITY PROFILE REGION FORMATION FOR VARYING BREAKDOWN VOLTAGE OF DEVICES

(75) Inventors: Douglas D. Coolbaugh, Essex Junction, VT (US); Louis D. Lanzerotti, Charlotte, VT (US); Bradley A. Orner, Fairfax, VT (US); Jay S. Rascoe, Underhill, VT (US); David C. Sheridan, Williston, VT (US); Stephen A. St. Onge, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 262 days.

(21) Appl. No.: 10/908,884

(22) Filed: May 31, 2005

(65) Prior Publication Data

US 2006/0270203 A1 Nov. 30, 2006

(51) Int. Cl.
*H01L 29/737* (2006.01)
(52) U.S. Cl. ............... 257/197; 257/565; 257/E29.174
(58) Field of Classification Search ............... 257/205, 257/197, 565, E29.174
See application file for complete search history.

(56) References Cited

U.S. PATENT DOCUMENTS

| | | | |
|---|---|---|---|
| 4,038,680 A * | 7/1977 | Yagi et al. ................ | 257/555 |
| 4,648,174 A | 3/1987 | Temple et al. | |
| 5,113,237 A | 5/1992 | Stengl | |
| 5,300,454 A | 4/1994 | Taft et al. | |
| 6,011,283 A * | 1/2000 | Lee et al. ................ | 257/273 |
| 6,396,107 B1 * | 5/2002 | Brennan et al. ........... | 257/362 |
| 6,720,637 B2 * | 4/2004 | Voldman .................. | 257/473 |
| 6,815,317 B2 | 11/2004 | Schafbauer et al. | |
| 7,064,416 B2 * | 6/2006 | Dunn et al. ............... | 257/566 |
| 2003/0094673 A1 * | 5/2003 | Dunn et al. ............... | 257/566 |
| 2004/0201039 A1 * | 10/2004 | Johansson et al. ......... | 257/198 |
| 2005/0035412 A1 * | 2/2005 | Norstrom et al. .......... | 257/370 |

OTHER PUBLICATIONS

Brack, K. et al., "Lateral Nonuniform Doping of Semiconductor Structures by Ion Implantation," IBM Technical Disclosure Bulletin, vol. 16, No. 10, Mar. 1974, pp. 3287-3288.

* cited by examiner

*Primary Examiner*—Michelle Estrada
*Assistant Examiner*—Jarrett J Stark
(74) *Attorney, Agent, or Firm*—Anthony J. Canale; Hoffman Warnick LLC

(57) ABSTRACT

Methods are disclosed for forming a varied impurity profile for a collector using scattered ions while simultaneously forming a subcollector. In one embodiment, the invention includes: providing a substrate; forming a mask layer on the substrate including a first opening having a first dimension; and substantially simultaneously forming through the first opening a first impurity region at a first depth in the substrate (subcollector) and a second impurity region at a second depth different than the first depth in the substrate. The breakdown voltage of a device can be controlled by the size of the first dimension, i.e., the distance of first opening to an active region of the device. Numerous different sized openings can be used to provide devices with different breakdown voltages using a single mask and single implant. A semiconductor device is also disclosed.

6 Claims, 4 Drawing Sheets

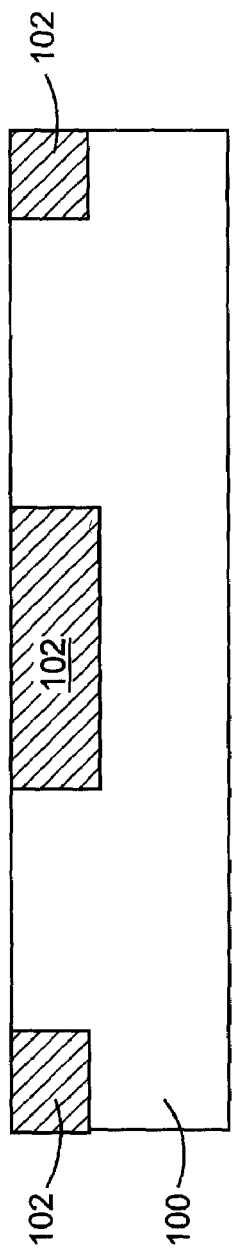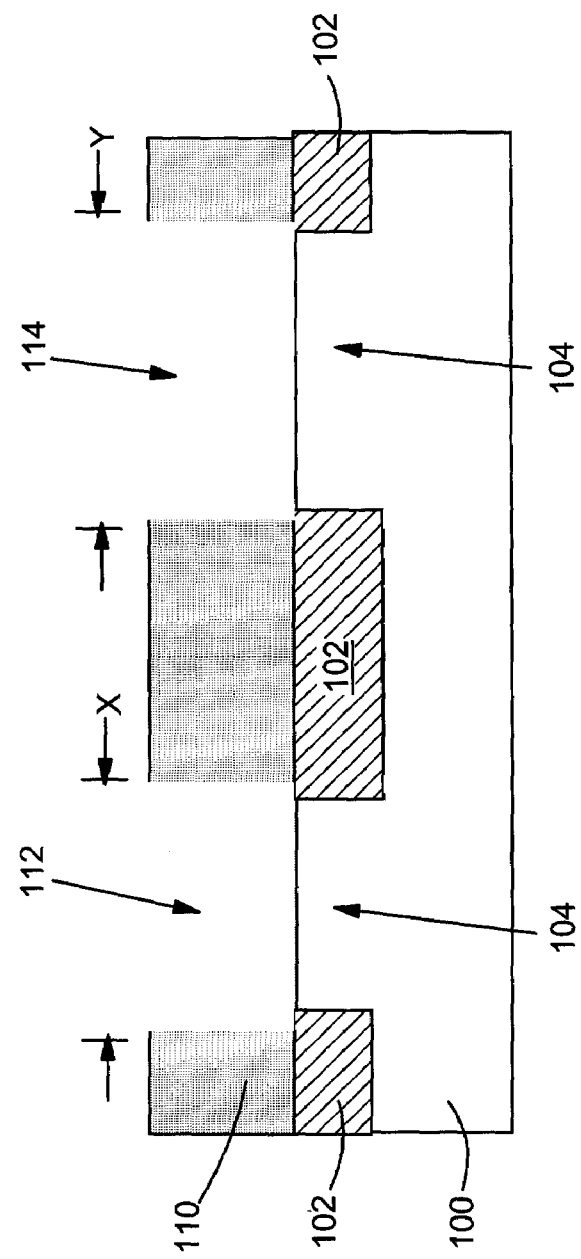

VARIED IMPURITY PROFILE REGION FORMATION FOR VARYING BREAKDOWN VOLTAGE OF DEVICES

BACKGROUND OF THE INVENTION

1. Technical Field

The present invention relates generally to semiconductor devices, and more particularly, to forming a varied impurity profile region for varying breakdown voltages of different devices.

2. Related Art

Bipolar semiconductor device technologies typically require multiple devices having different breakdown voltages on the same wafer for various circuit applications. Devices with different breakdown voltages have different performances due to the change in the collector transit time of the device that is obtained by varying the collector impurity profile between devices, which also modulates the breakdown voltage.

Multiple breakdown voltage devices are typically obtained by using a different mask and implant to tailor the collector impurity profile for each different breakdown voltage and performance device. This drives need for separate different masks and implants to tailor the collector profile for each different breakdown voltage and performance device. As a result of the additional mask/implant steps, bipolar technologies are expensive to implement. Accordingly, there is a need for bipolar technologies that provide lower cost implantation for generating these collector impurity profiles such that the cost of extra mask levels and implants are minimized. Some low cost alternative approaches include sharing the N-well mask/implant for the reach-through and collector of a device. However, these approaches are unsatisfactory because the thick resist needed to block the deep N-Well implants compromises the groundrules needed to minimize the size of the NPN device.

It is known to those skilled in the art of advanced complementary metal-oxide semiconductor (CMOS) device design and fabrication that N-Well-like implants may scatter out of the edge of the resist which blocks the implant in the field region. These scattered ions may disadvantageously dope the surface of the exposed silicon closest to the edge of the resist. This results in transistors having different threshold voltages depending on the transistor's proximity to the edge of the resist opening.

In view of the foregoing, there is a need in the art for a method of varying an impurity profile region in collectors of multiple devices on a single wafer to vary breakdown voltages using fewer masks and implants.

SUMMARY OF THE INVENTION

The invention includes methods for forming a varied impurity region profile for a collector using scattered ions while simultaneously forming a subcollector. In one embodiment, the invention includes: providing a substrate; forming a mask layer on the substrate including a first opening having a first dimension; and substantially simultaneously forming through the first opening a first impurity region at a first depth in the substrate (subcollector) and a second impurity region at a second depth different than the first depth in the substrate. The breakdown voltage of a device can be controlled by the size of the first dimension, i.e., the distance of first opening to an active region of the device. Numerous different sized openings can be used to provide devices with different breakdown voltages using a single mask and single implant. A semiconductor device is also disclosed.

A first aspect of the invention is directed to a method comprising the steps of: providing a substrate; forming a mask layer on the substrate including a first opening having a first dimension; and substantially simultaneously forming through the first opening a first impurity region at a first depth in the substrate and a second impurity region at a second depth different than the first depth in the substrate.

A second aspect of the invention includes a method of forming a varied impurity profile region above a subcollector of a semiconductor device, the method comprising the steps of: providing a substrate; forming a mask layer on the substrate including a first opening having a first dimension; and implanting impurity ions such that a first of the impurity ions are implanted through the first opening to form the subcollector and a second of the impurity ions are scattered off a portion of the mask layer and implanted through the first opening to form the varied impurity profile region at a second depth.

A third aspect of the invention related to a semiconductor device comprising: a substrate; a subcollector region having a first impurity region at a first depth in the substrate; and a first collector region having a second impurity region at a second depth different than the first depth in the substrate, wherein an impurity profile of the second impurity region comprises a high impurity concentration at an edge of the second impurity region, and a low impurity concentration near a center of the second impurity region.

A fourth aspect of the invention is directed to a method for use in forming a plurality of transistor devices, the method comprising the steps of: providing a substrate; forming a mask layer on the substrate including a plurality of openings, each opening having a dimension and at least two openings having dimensions that are different devices; and implanting impurity ions such that a first of the impurity ions are implanted through each opening to form a subcollector for each transistor device at a first depth and a second of the impurity ions are scattered off a portion of the mask layer and implanted through each opening to form a varied impurity profile region at a second depth, wherein the varied impurity profile region of each opening is based on a size of the dimension of the respective opening.

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein:

FIGS. 1-3 show a cross-sectional view of a method according to one embodiment of the invention.

DETAILED DESCRIPTION

Figure 3:
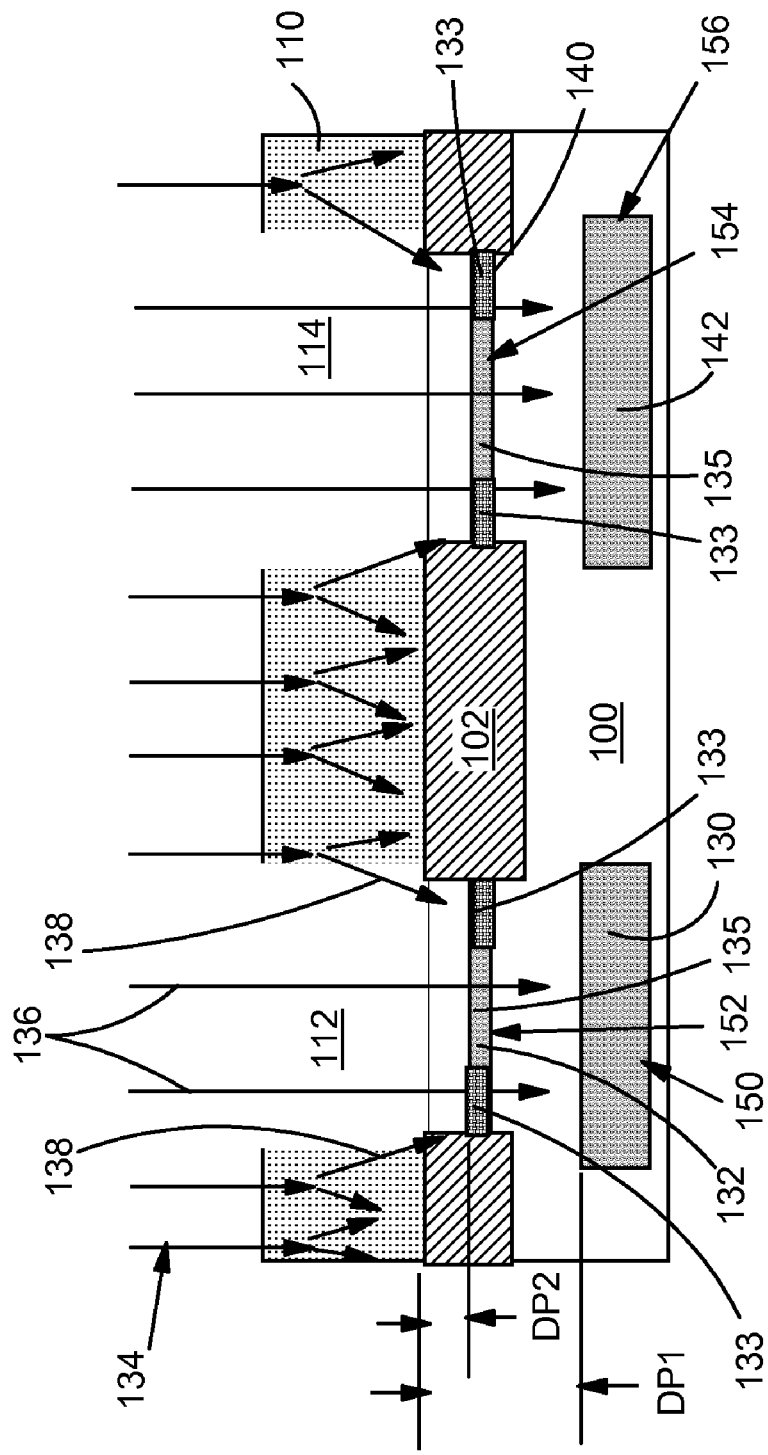

With reference to the accompanying drawings, FIGS. 1-3 show a method according to one embodiment of the invention. In one embodiment, the invention includes providing a substrate 100, e.g., of silicon, including a number of shallow trench isolations (STI) 102 surrounding selected active regions 104 (FIG. 2) for bipolar transistors to be formed.

Next, as shown in FIG. 2, a mask layer 110 is formed on substrate 100 including a first opening 112 having a first dimension X. Mask layer 110 may include any now known or later developed resist mask material. Alternatively, mask layer 110 may include a hard mask material (e.g., silicon dioxide ($SiO_2$)) instead of a resist mask to avoid possible manufacturing control problems, although this is more expensive and not the preferred method. In addition to first opening 112, any number of second openings 114 may also be formed for any number of devices (not shown) to be formed on substrate 100. A second opening 114 has a second dimension Y, which may be different than first dimension X for reasons to be explained below. Mask layer 110 and openings 112, 114 may be formed by any now known or later developed fashion. For example, a resist mask layer 110 may be patterned and developed using photolithographic processes.

Next, as shown in FIG. 3, a first impurity region 130 and a second impurity region 132 (from the scattered ions 138) are formed substantially simultaneously through first opening 112 via a single implant 134. Implant 134 has lower energy such that mask layer 110 absorbs all of the ions therein. During implant 134, first impurity region 130 is formed at a first depth (DP1) in substrate 100 and second impurity region 132 is formed at a second depth (DP2) that is different than the first depth, i.e., first depth (DP1) is greater than second depth (DP2). As shown in FIG. 3, implanting 134 impurity ions occurs such that a first 136 of the impurity ions are implanted through first opening 112 to form first impurity region 130 and a second 138 of the impurity ions are scattered off a portion of mask layer 110 and implanted through first opening 112 to form second impurity region 132. In this embodiment, first impurity region 130 is in a subcollector region 150 and second impurity region 132 is in a collector region 152.

Turning to second opening 114, a third impurity region 140 may also be substantially simultaneously formed with impurity ions that are scattered off a portion of the mask layer 110 adjacent second opening 114 and implanted through second opening 114. As will be described below, third impurity region 140 may have a different impurity profile than second impurity region 132. A fourth impurity region 142 (subcollector) may also be implanted substantially simultaneously with third impurity region 140. In this embodiment, third impurity region 140 is in a collector region 154 and fourth impurity region 142 is in a subcollector region 156.

Second and third impurity regions 132 and 140 have a varied impurity profile including a high impurity concentration 133 at an edge of the respective impurity region corresponding to an edge of the respective opening 112, 114 or region 132, 140, and a low impurity concentration 135 near a center of the respective opening 112, 114 or region 132, 140. Those skilled in the art will recognize that the high impurity concentration 133 and low impurity concentration 135 sections shown in FIG. 3 are only illustrative and not limiting of the extent that each section takes un with resnect to the impurity region. Thus, each region 132, 140 forms a varied impurity profile region. In contrast, first impurity region 130 and fourth impurity region 142 have a substantially uniform impurity profile. In addition, each of first and fourth impurity region 130, 142 extend outside an edge of active region 104. In contrast, the edge of second and third impurity regions 132, 140 correspond to an edge of active region 104 (i.e., an emitter opening in STI 102) in substrate 100.

Figure 4:
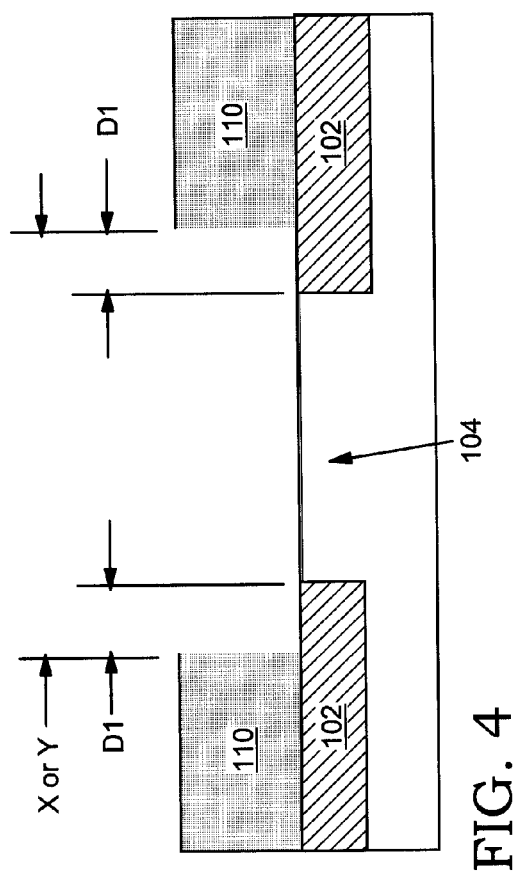
FIG. 4 shows an exploded view of one of the openings of FIG. 1.
Figure 5:
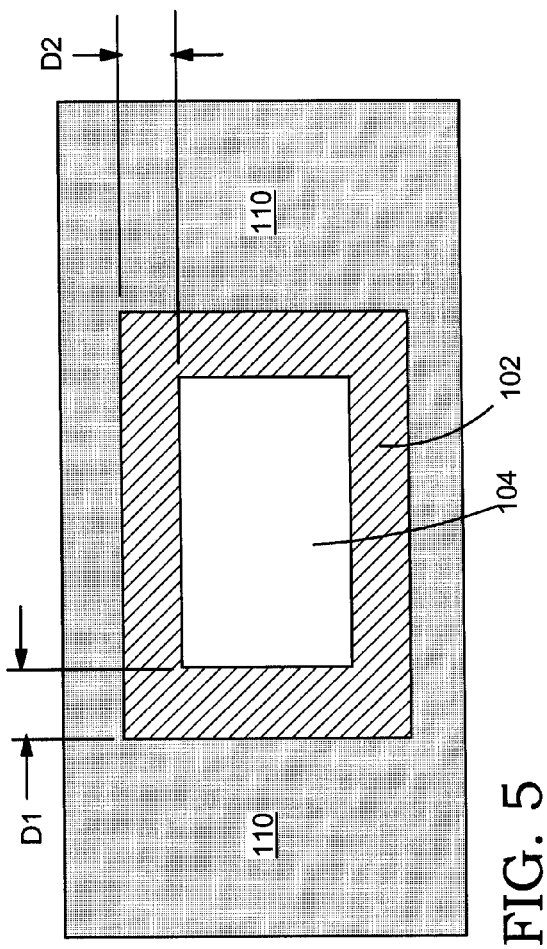
FIG. 5 shows a plan view of the opening of FIG. 2.

Referring to FIGS. 4 and 5, an impurity profile of second impurity region 132 and third impurity region 140 can be controlled by the size of the respective first dimension X (FIG. 2) or second dimension Y (FIG. 2). In particular, FIGS. 4 and 5 illustrate that first and second openings 112, 114 (only one shown) preferably have a dimension X or Y greater than an active region 104 formed within STI region 102. That is, first and second dimension X, Y are greater than a corresponding dimension of a respective active region 104. As shown in FIG. 5, first and second dimension X, Y may include subdimensions in orthogonal directions such that two distances D1 and D2 are formed between mask layer 110 and active region 104.

In conventional bipolar technology that uses high dose subcollector implants and epitaxial growth, the spacing between active region 104 and a subcollector mask layer 110 is considered to be of no importance so long as opening 112, 114 extends beyond active region 104. However, for low cost subcollector processes, conventional subcollector processes are being replaced by a masked high energy implanted subcollector process. The invention realizes that spacing between openings 112, 114 and active region 104 of a bipolar device is key to the breakdown voltage of the device and performance of these high energy implanted subcollectors with the identical implant. In particular, the greater distance D1 and/or D2 that mask layer 110 is from active region 104, the less impurity that is created by scattered ions 138 (FIG. 3). That is, by varying the spacing D1, D2 from mask layer 110 edge to active region 104, varying amounts of scattered implants 138 from mask layer 110 dope active region(s) 104 in varying amounts. This variation of implant dose versus distance of mask layer 110 from active region 104 allows creation of multiple breakdown voltage and performance devices on the wafer with one implant and mask layer process step. In particular, to obtain a low breakdown voltage, high performance device, scattering ions 138 are intentionally introduced by moving the respective opening 112, 114 closer to active region 104 to put scattered ions 138 in collector region 152, 154 of the device, making a pedestal. In contrast, to obtain a high breakdown voltage device, scattered ions 138 are reduced or eliminated by moving the respective openings 112, 114 away from active region 104 such that scattered ions 138 enter STI 102.

Figure 6:
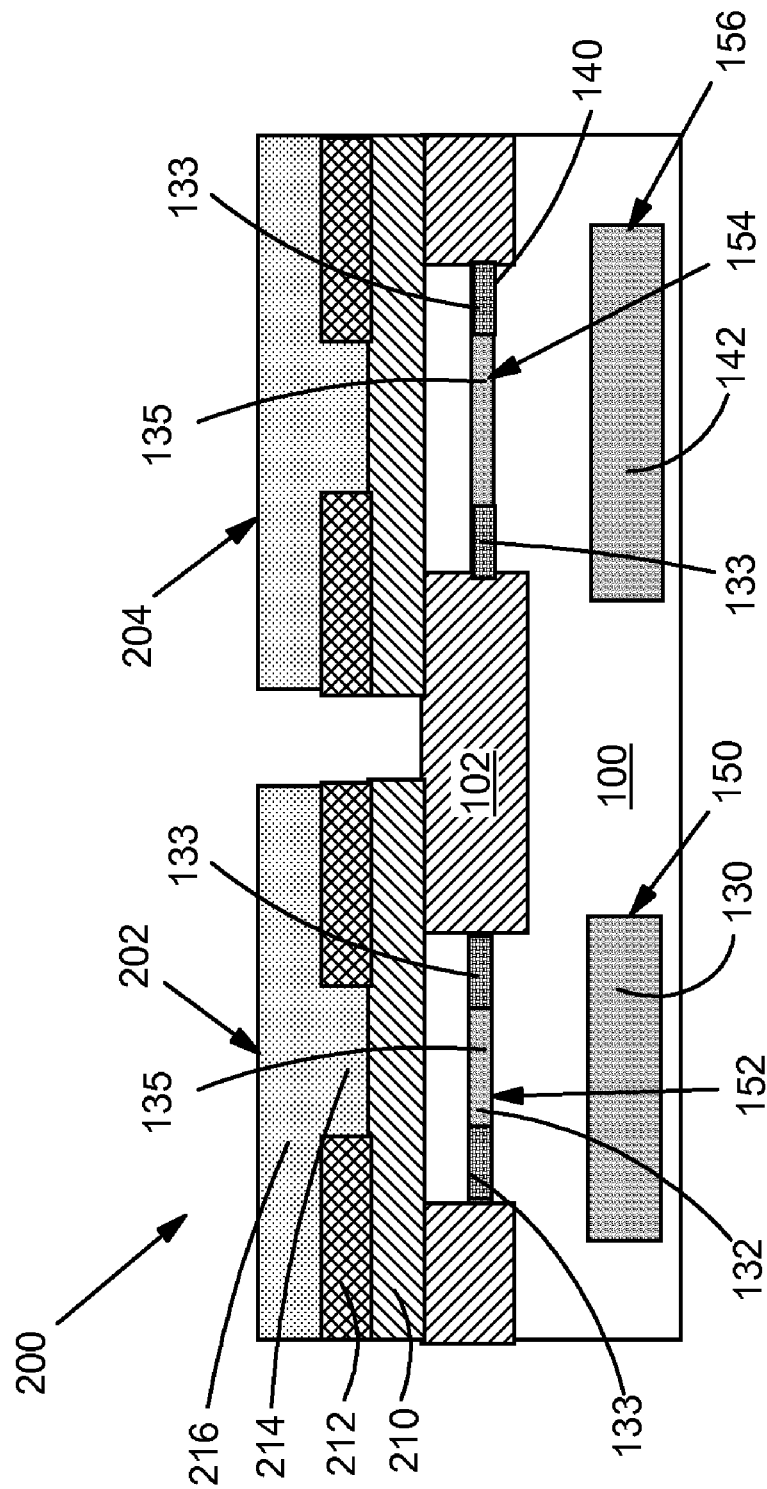
FIG. 6 shows a semiconductor device according to the invention.

Turning to FIG. 6, the above-described methods result in a semiconductor device 200 including substrate 100, subcollector region 150 having first impurity region 130 at first depth DPI in substrate 100, and first collector region 152 having second impurity region 132 at second depth DP2 different than first depth DPI in substrate 100. The rest of semiconductor device 200 is formed using conventional processing, e.g., growing a silicon germanium (SiGe) base 210, deposit a dielectric 212, open an emitter opening 214, and building an emitter 216. As described above, an impurity profile of second impurity region 132 includes a high impurity concentration 133 at an edge of second impurity region 132, and a low impurity concentration 135 near a center of second impurity region 132, i.e., the concentration of scattered ions is graded laterally across the active region of the device. Those skilled in the art will recognize that the high impurity concentration 133 and low impurity concentration 135 sections shown in FIG. 6 are only illustrative and not limiting of the extent that each section takes un with resnect to the impurity region. In contrast, first and fourth impurity regions 130, 142 (subcollector regions 150, 156) have a substantially uniform impurity profile. Device 200 may also include a second collector region 154 at a location different than first collector region 150, wherein second collector region 154 includes a third impurity region 140 having a different impurity profile than second impurity region 132. In this fashion, different bipolar transistor devices 202, 204 built over the different collector regions 150, 154 will have different breakdown voltages and performances. However, device 200 can be formed using a single mask layer 110 and a single implant 134. As a result, numerous bipolar transistor devices 202, 204 having different breakdown voltages can be formed just by changing mask layer 110 image instead of the conventional three different mask layer depositions and implant operations.

The subcollector leaves end of range defects at the depth at peak of the implant, and thus also at the edge of resist mask 110 in FIG. 4. Thus, end of range defects will be present at the edges of implants 150 and 156. Cross sectioning a wafer will reveal if the distance between subcollector mask edge and the intrinsic device is changed between the different devices.

Another embodiment of the invention includes a method for use in forming a plurality of transistor devices 202, 204 including: providing substrate 100, forming mask layer 110 on substrate 100 including a plurality of openings 112, 114, each opening having a dimension X or Y and at least two openings having dimensions that are different. As described above, a next step includes implanting impurity ions 134 such that a first 136 of the impurity ions are implanted through each opening to form a subcollector 130, 142 for each transistor device at a first depth DP1 and a second 138 of the impurity ions are scattered off a portion of mask layer 110 and implanted through each opening to form a varied impurity profile region 132, 140 at a second depth DP2. The varied impurity profile region 132, 140 of each opening is based on a size of the dimension of the respective opening.

Although the invention has been described relative to forming a varied impurity profile region in a collector, it should be recognized that the teachings of the invention are also applicable to other structure such as a diode dopant concentration in bipolar devices as well as any device that uses subcollectors and the lightly doped semiconductor thereabove, e.g., PN junctions, varactors, capacitors, moscaps, reachthroughs, etc.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A semiconductor device comprising:
   a substrate;
   a first subcollector having a first impurity at a first depth in the substrate; and
   a first collector having a second impurity at a second depth different than the first depth in the substrate,
   wherein an impurity profile of the second impurity that is within the first collector comprises a high impurity concentration that extends from near center of the first collector to a lateral edge of the first collector, and a low impurity concentration near the center of the first collector, and wherein the concentration of the second impurity is the same throughout the first collector region.

2. The semiconductor device of claim 1, wherein the first impurity has a substantially uniform impurity profile.

3. The semiconductor device of claim 1, wherein the lateral edge of the second impurity corresponds to an edge of an emitter opening in a shallow trench isolation in the substrate.

4. The semiconductor device of claim 1, further comprising a second collector in the semiconductor device at a location different than the first collector, and wherein the second collector includes a third impurity having a different impurity profile than the second impurity.

5. The semiconductor device of claim 4, further comprising a second subcollector below the second collector.

6. The semiconductor device of claim 4, wherein an impurity profile of the third impurity that is within the second collector comprises a high impurity concentration located within an area of the second collector that extends from near center of the second collector to a lateral edge of the second collector, and a low impurity concentration near the center of the second collector.

* * * * *